United States Patent [19]
Lee

[11] Patent Number: 5,970,383
[45] Date of Patent: Oct. 19, 1999

[54] METHOD OF MANUFACTURING A SEMICONDUCTOR DEVICE WITH IMPROVED CONTROL OF DEPOSITION LAYER THICKNESS

[75] Inventor: Chii-Chang Lee, Austin, Tex.

[73] Assignee: Advanced Micro Devices, Austin, Tex.

[21] Appl. No.: 08/992,381

[22] Filed: Dec. 17, 1997

[51] Int. Cl.[6] .................................................. H01L 21/316
[52] U.S. Cl. .......................... 438/788; 438/905; 438/958; 438/790; 438/787; 438/789; 438/778; 438/758
[58] Field of Search .................................... 438/758, 778, 438/787, 788, 789, 790, 905, 906, 958; 427/537, 579

[56] References Cited

U.S. PATENT DOCUMENTS

| | | | |
|---|---|---|---|
| 3,862,852 | 1/1975 | Kamins | 117/106 A |
| 4,622,120 | 11/1986 | Gillery | 204/192.26 |
| 4,859,492 | 8/1989 | Rogers, Jr. et al. | 427/42 |
| 4,913,652 | 4/1990 | Tanji et al. | 432/156 |
| 4,960,488 | 10/1990 | Law et al. | 156/643 |
| 5,000,113 | 3/1991 | Wang et al. | 118/723 |
| 5,041,311 | 8/1991 | Tsukune et al. | 427/255.3 |
| 5,129,958 | 7/1992 | Nagashima et al. | 134/22.1 |
| 5,158,644 | 10/1992 | Cheung et al. | 156/643 |
| 5,207,836 | 5/1993 | Chang | 134/1 |
| 5,352,487 | 10/1994 | Klinedinst et al. | 427/248.1 |
| 5,510,297 | 4/1996 | Telford et al. | 438/683 |
| 5,647,953 | 7/1997 | Williams et al. | 156/643.1 |
| 5,712,702 | 1/1998 | McGahay et al. | 356/311 |
| 5,728,602 | 3/1998 | Bellows et al. | 438/905 |
| 5,728,629 | 3/1998 | Mizuno et al. | 438/680 |

OTHER PUBLICATIONS

Wolf Stanley, Silicon Processing for the VLSI Era, vol. 1, p. 170, 1990.

Primary Examiner—Charles Bowers
Assistant Examiner—Thanh Nguyen
Attorney, Agent, or Firm—Merchant & Gould P.C.

[57] ABSTRACT

The uniformity of the thickness of a deposition layer, generated by a chemical vapor deposition (CVD) process, on a semiconductor wafer is enhanced by providing an undercoating on the deposition chamber. The undercoating is formed at a deposition rate significantly faster than the deposition rate of the material on the wafer. A thin precoat is typically formed over the undercoating. Another method of providing uniformity of thickness includes altering the temperature of the wafer or a series of wafers to alter the deposition rate. The alteration of the temperature of the wafer may include the use of a temperature ramp which increases or decreases the deposition temperature between two or more wafers in a series of wafers.

18 Claims, 3 Drawing Sheets

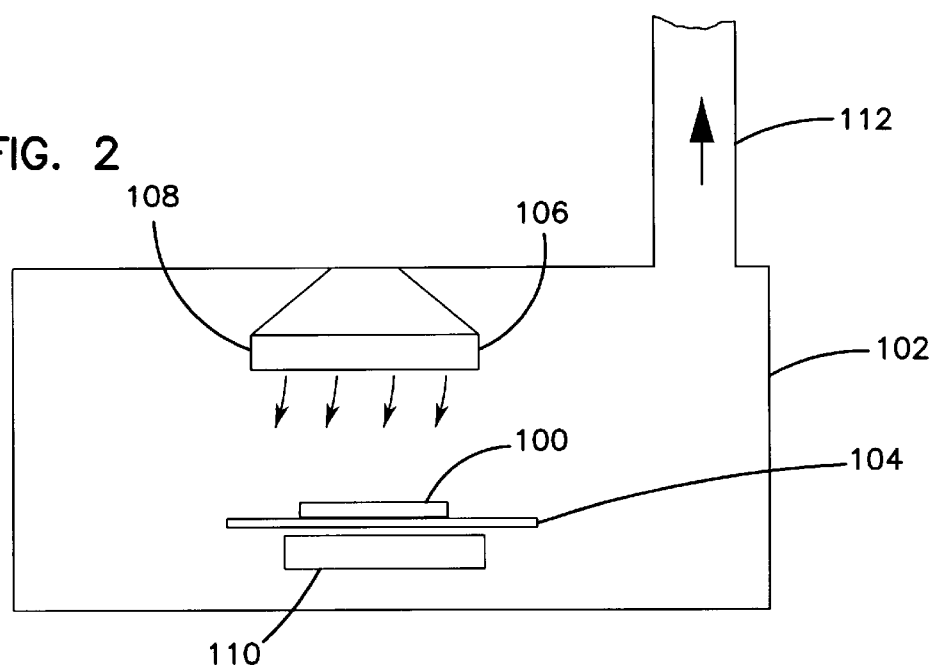
FIG. 2
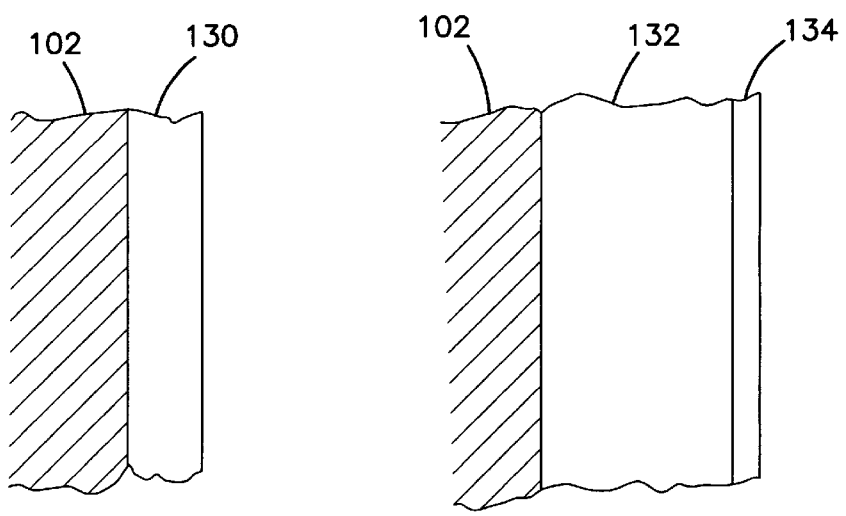
FIG. 3
(Prior Art)
FIG. 4

5,970,383

METHOD OF MANUFACTURING A SEMICONDUCTOR DEVICE WITH IMPROVED CONTROL OF DEPOSITION LAYER THICKNESS

FIELD OF THE INVENTION

The present invention is directed generally to a method of manufacturing a semiconductor device and, more particularly, to a method of manufacturing a semiconductor device with improved control of deposition layer thickness.

BACKGROUND OF THE INVENTION

Over the last few decades, the electronics industry has undergone a revolution through the use of semiconductor technology to fabricate small, highly integrated electronic devices. The most common semiconductor technology presently used is silicon-based. A large variety of semiconductor devices have been manufactured for various applications in numerous disciplines. Such silicon-based semiconductor devices include metal-oxide-semiconductor (MOS) transistors, complimentary MOS (CMOS) transistors, bipolar transistors, bipolar CMOS (BiCMOS) transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

Many semiconductor devices have multiple layers of material that are deposited over a substrate to form one or more portions of the device (e.g., the gate electrode in a MOS device), as well as conducting lines and vias to connect devices and dielectric layers to isolate portions of the device and prevent unwanted connections. These layers can be deposited by a variety of techniques including chemical vapor deposition (CVD), sputtering, and evaporation.

Dielectric layers form barriers to isolate the other layers of the semiconductor device. Oxide materials are commonly used in semiconductor devices to form these dielectric barriers. For example, an oxide layer may separate a gate electrode from a substrate and adjacent active regions in a MOS semiconductor device or an oxide layer may fill a trench in devices that utilize trench isolation techniques to separate active regions in a substrate. Oxide layers may also isolate metal conductive lines. These oxide layers are often made of silicon dioxide, but other dielectric materials are commonly used for the same purposes.

Thin oxide layers, typically less than a few hundred angstroms, may be formed by thermal oxidation of the silicon substrate. To form thicker oxide layers or other oxide layers that can not be formed by thermal oxidation, chemical vapor deposition (CVD) is typically used. CVD typically involves reacting at least two gaseous materials to form a solid oxide. One method for forming silicon dioxide layers includes reacting tetraethyl orthosilicate (TEOS) with oxygen at about 400° C. using well-known techniques such as Plasma Enhanced Chemical Vapor Deposition (PECVD).

Uniformity in deposition thickness between semiconductor wafers is a highly desirable property. Such uniformity often simplifies subsequent processing steps. However, the thickness of CVD layers can vary widely among devices prepared under similar conditions. This variation can create a corresponding variability in device parameters, which is typically undesirable. Thus, there is a need for methods of improving control and uniformity of deposition layer thickness.

SUMMARY OF THE INVENTION

Generally, the present invention relates to a method of manufacturing a semiconductor device. One embodiment is a method of making a semiconductor device, which includes depositing an undercoating of a first deposition material on one or more walls of a chamber at a first deposition rate. Next, at least one semiconductor wafer is placed in the chamber and a coating of a second deposition material is formed on a surface of the wafer at a second deposition rate. The first deposition rate is faster than the second deposition rate. In some embodiments, the first and second deposition materials are the same.

Another embodiment is a method of making a semiconductor device which includes sequentially depositing a coating of a deposition material on a series of semiconductor wafers. During the sequential deposition of the coating, the deposition temperature is changed to alter the deposition rate of the coating.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2 is a cross-sectional view of a deposition chamber;

FIG. 3 is a cross-sectional view of a wall of the deposition chamber of FIG. 2 having a precoat layer, as provided in the prior art;

FIG. 4 is a cross-sectional view of a wall of the deposition chamber of FIG. 2 having an undercoat and precoat, as provided in one embodiment of the present invention.

Figure 1:
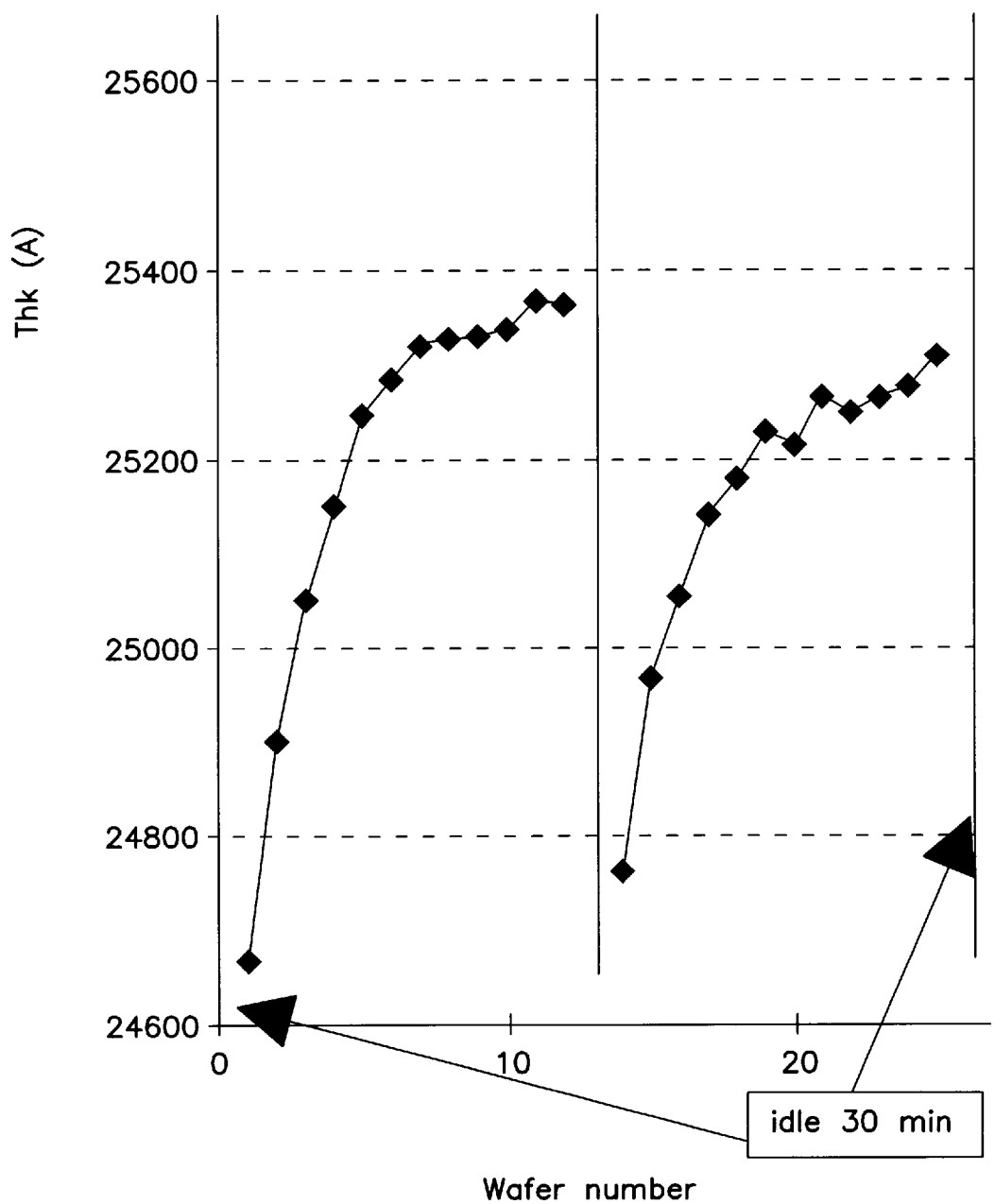
FIG. 1 is a graph of deposition layer thickness for a number of wafers using prior art deposition methods.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have one or more layers formed by chemical vapor deposition (CVD) and, in particular, to devices that have one or more oxide layers formed by plasma enhanced chemical vapor deposition (PECVD) of tetraethyl orthosilicate (TEOS). The present invention is applicable to a number of semiconductor devices including, for example, MOS, CMOS, bipolar, and biCMOS transistors. While the present invention is not limited to such devices, an appreciation of various aspects of the invention will be gained through a discussion of various fabrication processes and devices in connection with the examples provided below. In particular, the invention will be described with respect to the formation of a silicon dioxide layer from TEOS using PECVD. However, it will be understood that methods other than PECVD and materials other than TEOS may be used.

Referring to FIG. 2, a semiconductor wafer 100 is introduced into a CVD reactor chamber 102 and placed between two electrodes 104, 106. Typically, at least one of the electrodes is attached to a voltage source which oscillates at a radiofrequency (RF). The other electrode can be connected to the RF source or may be permanently grounded. When the RF source is energized a constantly varying electric field is generated between the two electrodes.

One or more reactive gases (e.g., TEOS and $O_2$) are introduced into the reactor chamber 102 through a showerhead 108. The showerhead 108 may also function as an electrode. Optionally, the reactive gases may be carried within a stream of an inert gas, such as Ar or He. The electrodes 104, 106 are energized to form a plasma (i.e., glow discharge) between the electrodes. The interaction of the plasma with the reactive gases generates the material (e.g., silicon dioxide) which is deposited on the wafer 100. Typically, to increase the reactivity of the gases and the preferential deposition of material on the surface of the wafer 100, a heater 110 heats the wafer 100 to a desired reaction temperature.

An exhaust port 112 is provided to carry excess gases out of the chamber and to keep the relative pressures of the reactive gases and optional inert carrier gas approximately constant. Typically, a vacuum source (not shown) is attached to the exhaust port 112 to keep the pressure within the chamber 102 at a few torr or less. Low pressure is typically required for a sustainable plasma to be formed. The CVD chamber 102 also typically contains or is coupled to a conveyance device (not shown) for moving the wafers 100 into and out of the chamber 102.

The semiconductor wafers 100 are typically introduced into the chamber 102 in a series. For example, a series of twelve wafers 100 may be sequentially introduced into the chamber. Each series is typically followed by a cleaning cycle, as described below.

As the deposition layer is formed on the semiconductor wafer 100, a deposition layer is also formed on the walls, the electrodes 104, 106, and the showerhead 108 of the chamber 102. The deposition rate on these portions of the chamber may be different than the deposition rate on the wafer. This layer of deposited material on the walls, electrodes, and showerhead of the chamber 102 becomes thicker with each wafer 100 that is processed. If the deposited material on the walls, electrodes, and showerhead of the chamber 102 becomes too thick, portions of the deposited material may flake off the wall and contaminate the wafer 100. The deposited material is cleaned when the deposition thickness becomes large. For example, the chamber 102 may be cleaned when it is estimated, using the deposition rate, that 10 to 20 $\mu$m of material has been deposited on the wafers 100.

One method of cleaning the chamber 102 is a plasma cleaning technique which utilizes chemicals that remove the particular deposition compounds. For example, if the deposition layer is made of silicon oxide, fluorine-containing compounds can often be used to clean the chamber walls. These fluorine-containing compounds readily react with silicon dioxide to remove the material deposited in the chamber 102. Examples of suitable fluorine-based compounds include $CF_4$, $C_2F_6$, $C_3F_8$, $C_4F_{10}$, and higher perfluorinated alkanes. Once the fluorine-containing compounds are introduced into the chamber in a gaseous form, the electrodes 104, 106 are energized so that a plasma including the fluorine-containing compounds is formed. The compounds in the plasma react with the deposited material to remove that material.

In conventional processes, after cleaning or when switching between recipes (e.g., changing the deposition rate or using different reactive gases), a precoat 130 of the deposition material is often formed on the walls, electrodes, and showerhead of the chamber 102, as illustrated in FIG. 3, prior to processing the semiconductor wafers 100. This conventional precoat is formed using the same deposition conditions (e.g., gas flow rate and composition) as the coating that will be deposited on the wafers. The formation of such a precoat is recommended because it produces a coating on the chamber that is very similar to the deposition layer that is to be deposited on the wafers and allows the reactor to stabilize with respect to the particular deposition conditions. In particular, it allows valves which are adjusted for the desired gas flow rate to stabilize, so that they provide consistent output.

However, it is found that under normal operating conditions with a conventional precoat, the thickness of the deposited material formed on the semiconductor wafers varies significantly for wafers in the same series. This is illustrated in FIG. 1 which graphs the thickness of a CVD oxide layer deposited on 25 semiconductor wafers which have been separated into two series. The vertical line in the center of FIG. 1 represents a plasma cleaning between the two series of wafers. A conventional precoat was applied to the chamber prior to processing each series (i.e., a first precoat was applied before the first series and a second precoat was applied after the plasma cleaning and prior to beginning the second series). For each wafer, the deposition time and rate of gas flow were the same.

The thickness of the deposited material is typically at a minimum for wafers processed immediately after the chamber has been cleaned. The CVD oxide layer deposited on the first wafer in each of the series graphed in FIG. 1 had a thickness ranging from 2460 nm to 2480 nm. The oxide layer thickness increased nonlinearly through the series of wafer until the oxide layer formed on the final wafer in each series had a thickness ranging from 2520 nm to 2540 nm. The difference in oxide layer thickness for these two series ranged from about 5% to 80 nm, which is about 2 to 30 of the total thickness.

When the variation in the thickness of the deposited material is 2 to 3% or more of the total thickness, subsequent processing steps, such as the planarization of the deposited material, may become more difficult or require additional process steps to ensure uniformity in the deposited layers. A lack of uniformity in a CVD layer thickness may have a negative impact on the uniformity in the operating parameters of the semiconductor device.

Typically, less variability in the deposition layer thickness is achieved by using a thicker precoat. A precoat thickness of about 2 to 4 $\mu$m, preferably about 2.5 to 3.5 $\mu$m, is typically required to substantially remove the variability in deposition layer thickness. However, forming a thicker conventional precoat requires an additional amount of time which increases the overall processing time for the semiconductor wafers. Because of the additional difficulties in later process steps due to non-uniform CVD layer thickness and the additional time needed to provide a thick precoat to remedy this condition, there is a need for a modified procedure for depositing a CVD layer on a semiconductor wafer which provides a relatively uniform layer thickness in less time.

One embodiment of the invention includes the formation of an undercoat 132 followed by a thin precoat 134 on the walls, electrodes, and showerhead of the chamber 102, as depicted in FIG. 4. The formation of the thin precoat 134 utilizes the same conditions as the formation of the deposition layer on the wafers 100. However, the deposition rate of the undercoat 132 is significantly faster than the deposition rate of the thin precoat 134 (which is typically the same as the deposition rate of the deposition material on the semiconductor wafer 100).

The deposition rates and resultant thicknesses can vary with the type of CVD layer being deposited. Generally, the deposition rate of the undercoat 132 is at least 15% faster than the deposition rate of the precoat 134 and the CVD layer on the wafer 100. In another embodiment, the undercoat deposition rate is at least 30% faster that the precoat deposition rate. In yet another embodiment, the undercoat deposition rate is at least 50% faster. This provides a thicker layer of deposition material on the walls (and other portions) of the chamber 102 in a shorter period of time. However, it also provides for the advantages of a precoat because of the formation of the thin precoat layer 134.

The deposition rates for the undercoat are relatively high and may be, for example, between about 2700 and 5000 angstroms/min, or higher. The actual range of deposition rates will typically depend on the material being used for the deposition. The deposition rate of the precoat (and the oxide layer on wafer 100) is less than for an undercoat made using the same material and may be, for example, between about 1500 and 3000 angstroms/min.

By way of example, a process for forming a TEOS silicon dioxide layer using TEOS and $O_2$ and the above-described techniques will be illustrated. After cleaning the chamber, an undercoating of TEOS-generated silicon dioxide is applied to the chamber. The deposition rate for an undercoat using TEOS may be, for example, between about 2700 and 3700 angstroms/min. The undercoat is typically applied to a thickness of at least 1.5 $\mu$m. In some embodiments, the undercoat thickness is at least about 1.8 $\mu$m and, in others, at least about 2.0 $\mu$m.

Following the undercoat, a thin precoat of silicon dioxide is applied. A conventional precoat using TEOS is typically deposited at, for example, between about 1500 and 2200 angstroms/min. The thin precoat is typically applied for about 10 to 60 seconds, providing a precoat having a thickness ranging from about 0.025 $\mu$m to 0.22 $\mu$m for TEOS deposition.

Using the above-described process, a composite coating having a particular thickness (i.e., the combined precoat and undercoat thickness) can be formed in less time than a conventional precoat of an equivalent thickness. For example, in many applications, no more than 6 minutes is allowed for a coating process. With conventional techniques using TEOS, a conventional precoat layer with a thickness of only about 1.4 $\mu$m can be formed in this time frame. With the above process using TEOS, a composite coating of an undercoat and a thin precoat having a thickness of about 2.2 $\mu$m can be formed in about 6 minutes.

Figure 5A:
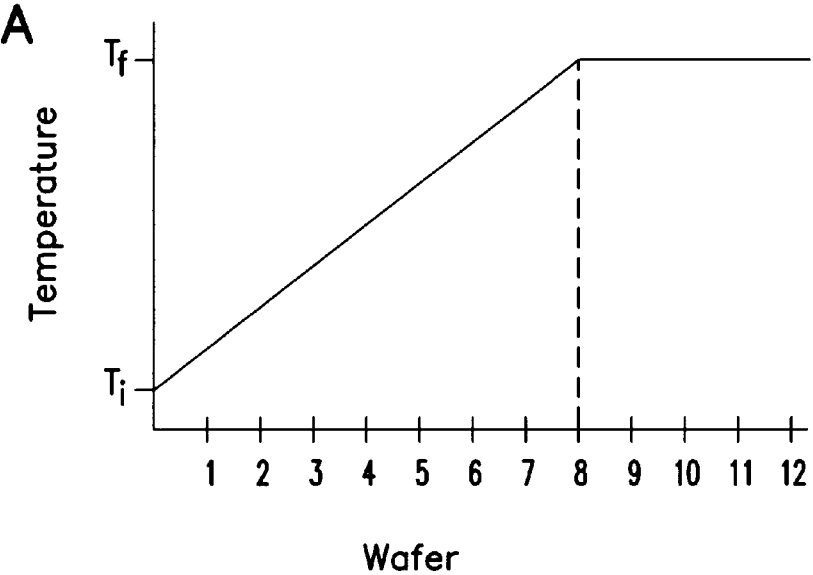
FIGS. 5A and 5B are graphs of temperature ramps for use in another embodiment of the present invention.
Figure 5B:
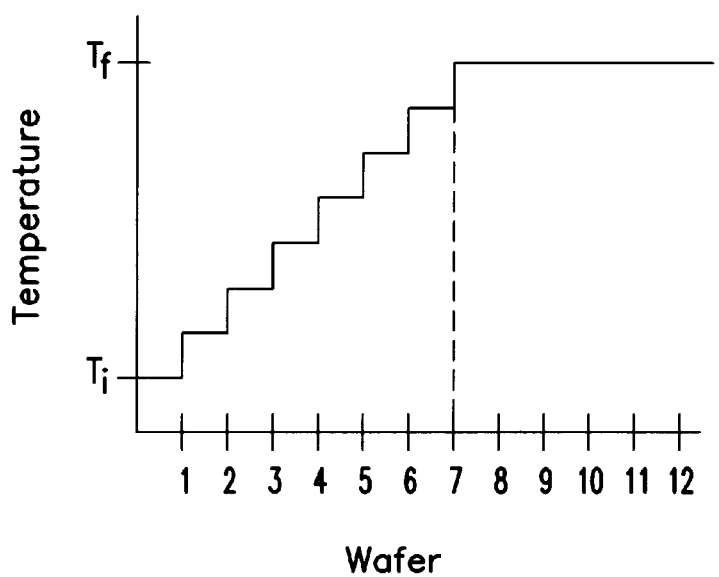

In another embodiment of the invention, only a precoat is applied, but the deposition temperature (i.e., the temperature of the wafer) is altered over a period of time. Typically, this alteration in temperature takes place over a period of time during which several wafers are processed, as illustrated in FIGS. 5A–5B. Altering the temperature will typically alter the rate of deposition and therefore the thickness of a layer deposited over a given period of time. The amount of alteration in temperature that is required to provide uniformity of deposition, as well as the direction of that alteration (i.e., either an increase or decrease in temperature), will depend, at least in part, on the reactive gases, the thermodynamics of the reaction between the reactive gases, and the substrate.

The alteration in temperature may include a temperature ramp, as depicted in FIGS. 5A and 5B. The temperature ramp may be either an increase or decrease in temperature over time. The temperature ramp may be a continuous ramp of temperature over a period which includes the processing of one or more wafers, as shown in FIG. 5A. This continuous ramp need not be linear, but may take other functional forms, including, for example, exponential or logarithmic. Furthermore, the ramp may be formed using a combination of functions. For example, the ramp may be a linear ramp over a first set of wafers (e.g., two to five wafers) and then an exponential ramp or a linear ramp with different parameters over a second set of wafers (e.g., the next two to five wafers).

In one embodiment, a single ramp is constructed for use under a variety of deposition conditions. This allows the ramp to be used, potentially, with many different deposition recipes so that an operator does not need to change the ramp parameters each time a new recipe is used.

In another embodiment, a temperature controller (not shown) may monitor the temperature of a temperature probe (not shown) in the chamber 102. The temperature controller may increase or decrease the amount of heat applied in response to the measurement from the temperature probe. It will be understood, however, the temperature at the temperature probe may not be the same as the temperature at the wafer or the showerhead. This is typically not as important as uniformity in the ramp sequence (i.e., the temperature probe is at a given temperature at a given time in the sequence).

The temperature ramp may, instead, be a series of steps, as depicted in FIG. 52. The steps may, for example, occur when each wafer is placed into the chamber or when each wafer is removed from the chamber. One example of a stepped temperature ramp is a ramp between 395° C. and 400° C. with 0.5° C. increases in temperature for each of the first ten wafers. The size of the steps may depend on the reactive gases, the thermodynamics of the reaction, and the substrate. The size of the steps may be the same for each wafer or they may increase or decrease irregularly or regularly (e.g., linearly, exponentially, or logarithmically). Furthermore, the ramp sequence may or may include a waiting period to allow for the temperature to equilibrate after it has been changed.

The temperature ramp and the undercoat may both be used simultaneously to enhance the uniformity of the thickness of the deposition layer on the wafer. A combination of temperature ramp and undercoat may also save processing time, as a thinner undercoat may be used; the non-uniformity introduced by the thinner undercoat being compensated by the temperature ramp.

As noted above, the present invention is applicable to the fabrication of a number of different devices which contain a layer formed by CVD. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of making a semiconductor device, comprising:
    depositing an undercoating of a first deposition material on one or more portions of a chamber at a first deposition rate;
    placing at least one semiconductor wafer in the chamber after depositing the undercoating on the one or more portions of the chamber; and
    depositing a coating of a second deposition material on a surface of the wafer at a second deposition rate, wherein the first deposition rate is faster than the second deposition rate.

2. The method of claim 1, wherein the first and second deposition materials are the same.

3. The method of claim 1, wherein the method further comprises depositing a precoating of the second deposition material on the one or more portions of a chamber at a third deposition rate, the precoating being deposited prior to placing the at least one semiconductor wafer in the chamber.

4. The method of claim 3, wherein the second and third deposition rates are substantially the same.

5. The method of claim 1, wherein placing at least one semiconductor wafer in the chamber and depositing a coating a second deposition material comprises
    a) introducing, into a chamber, a group of one or more semiconductor wafers from a series of semiconductor wafers;
    b) depositing a coating of the second deposition material on the group of one or more semiconductor wafers at a deposition temperature;
    c) removing the group of one or more semiconductor wafers from the chamber;
    d) repeating steps a), b), and c) to deposit a coating of the second deposition material on each semiconductor wafer in the series of semiconductor wafers; and
    e) changing the deposition temperature in the chamber at least once during performance of steps a)–d).

6. The method of claim 5, wherein changing the deposition temperature comprises ramping a temperature of the chamber.

7. The method of claim 6, wherein ramping the temperature of the chamber comprises increasing the temperature of the chamber by discrete intervals with each placement of the at least two semiconductor wafers in the chamber.

8. The method of claim 7, wherein the discrete intervals are regular.

9. The method of claim 6, wherein ramping the temperature of the chamber comprises continually increasing the temperature of the chamber as a coating of the second deposition material is deposited on different groups of one or more semiconductor wafers.

10. The method of claim 1, wherein the first deposition rate ranges from about 2700 angstroms/min to about 5000 angstroms/min.

11. The method of claim 1, wherein the second deposition rate ranges from about 1500 angstroms/min to about 3000 angstroms/min.

12. The method of claim 1, wherein the second deposition material is silicon dioxide.

13. The method of claim 1, wherein the second deposition material is derived from reactant material in the chamber.

14. The method of claim 13, wherein the reactant material comprises tetraethyl orthosilicate (TEOS).

15. The method of claim 14, wherein the first deposition rate, using TEOS, ranges from about 2700 angstroms/min to about 3700 angstroms/min.

16. The method of claim 14, wherein the second deposition rate, using TEOS, ranges from about 1500 angstroms/min to about 2200 angstroms/min.

17. The method of claim 1, wherein the first deposition rate is at least 15% faster than the second deposition rate.

18. The method of claim 1, wherein the undercoating has a thickness of at least 1.5 $\mu$m.

* * * * *